United States Patent [19]
Wiciel

[11] Patent Number: 5,636,729
[45] Date of Patent: Jun. 10, 1997

[54] PIEZO SWITCH

[76] Inventor: Richard Wiciel, 13 Farrwood Rd., Windham, N.H. 03087

[21] Appl. No.: 489,414

[22] Filed: Jun. 12, 1995

[51] Int. Cl.⁶ .................................................. H01H 57/00
[52] U.S. Cl. ........................ 200/181; 200/314; 310/339
[58] Field of Search .............................. 200/181, 314, 200/313, 310; 310/339, 369

[56] References Cited

U.S. PATENT DOCUMENTS

| | | | |
|---|---|---|---|
| 3,303,290 | 2/1967 | Suloway | 200/181 |
| 3,648,279 | 3/1972 | Watson | 200/181 |
| 3,909,924 | 10/1975 | Vindasius et al. | 29/574 |
| 4,295,373 | 10/1981 | Moffatt | 73/505 |
| 4,430,595 | 2/1984 | Nakasone et al. | 310/339 |
| 4,530,138 | 7/1985 | Ritter | 29/25.35 |
| 4,683,359 | 7/1987 | Wojtanek | 200/314 |
| 5,442,150 | 8/1995 | Ipcinski | 200/181 |

*Primary Examiner*—David J. Walczak
*Attorney, Agent, or Firm*—Bromberg & Sunstein LLP

[57] ABSTRACT

A piezo-electric switch with a lighted push-button. The piezo switch has a case for mounting the push-button, a piezo element with a hole in it, and a hollow spacer for separating the push-button from the piezo element; the holes in the spacer and piezo element are aligned with each other. Within the case is mounted a light source, where the light source may be positioned within the hole in the spacer, or in the hole in the piezo element, but in either configuration allowing light to shine through the holes to illuminate the push-button.

8 Claims, 9 Drawing Sheets

5,636,729

PIEZO SWITCH

TECHNICAL FIELD

The present invention relates to apparatus and methods for electrical switches, and more particularly to apparatus and methods utilizing piezo electric crystal activated switches.

BACKGROUND ART

The prior art is rich with approaches to using piezo electric crystal activated switches. However such switches are typically subject to undesirable thermal influences. In addition they typically are not suited to many applications in which actuation must occur in an environment characterized by either imprecise or moderate motion by an actuator, since the piezo element can accept force changes that occur only over a very small range of motion.

SUMMARY OF THE INVENTION

The present invention provides, in some embodiments, a piezo switch that provides improved thermal isolation to the crystal element. The switch in a preferred embodiment has a case, for mounting a push button region having a first surface accessible to a tactile input and a second surface opposite the first surface. The embodiment also has a piezo electric crystal element mounted to the case and having a contact area. A spacer is mounted in physical communication between the second surface of the push button region and the contact area of the crystal, and serves to transmit the tactile input, received by the first surface, to the crystal, causing the crystal to provide as a result an electrical response to the tactile input. The crystal is mounted by a distance, determined at least in part by the length of the spacer, away from the push button region; this distance provides an amount of thermal isolation between the crystal and the push button region.

In a further embodiment, (i) the push button region is light transmissive and (ii) the second surface of the push button and the contact area of the crystal define a separation space in the case. In this embodiment the switch also has a light source disposed in the case and a light path from the source to the push button region. The light path extends through at least a portion of the separation space. In still further embodiments, the crystal includes a hole and the spacer has an opening, the hole and opening being in communication with each other, and least one of the light path and the light source is disposed in the hole and in the opening. The spacer may have an external end forming the push button region and an internal end in physical communication with the contact area of the crystal.

In another embodiment, the switch lacks a light source but has a spring, having a first region for receiving an external physical input and a second region in contact with the tactile input of the push button region, so that a range of physical inputs to the switch may be accommodated.

Related methods are also provided.

BRIEF DESCRIPTION OF THE DRAWINGS

The foregoing features of the present invention will be more readily understood by reference to the following detailed description taken with the accompanying drawings, in which.

DETAILED DESCRIPTION OF SPECIFIC EMBODIMENTS

Pertinent to the present application is my co-pending U.S. application Ser. No. 08/489,410, filed simultaneously herewith; this related application is hereby incorporated herein by reference.

Figure 1:
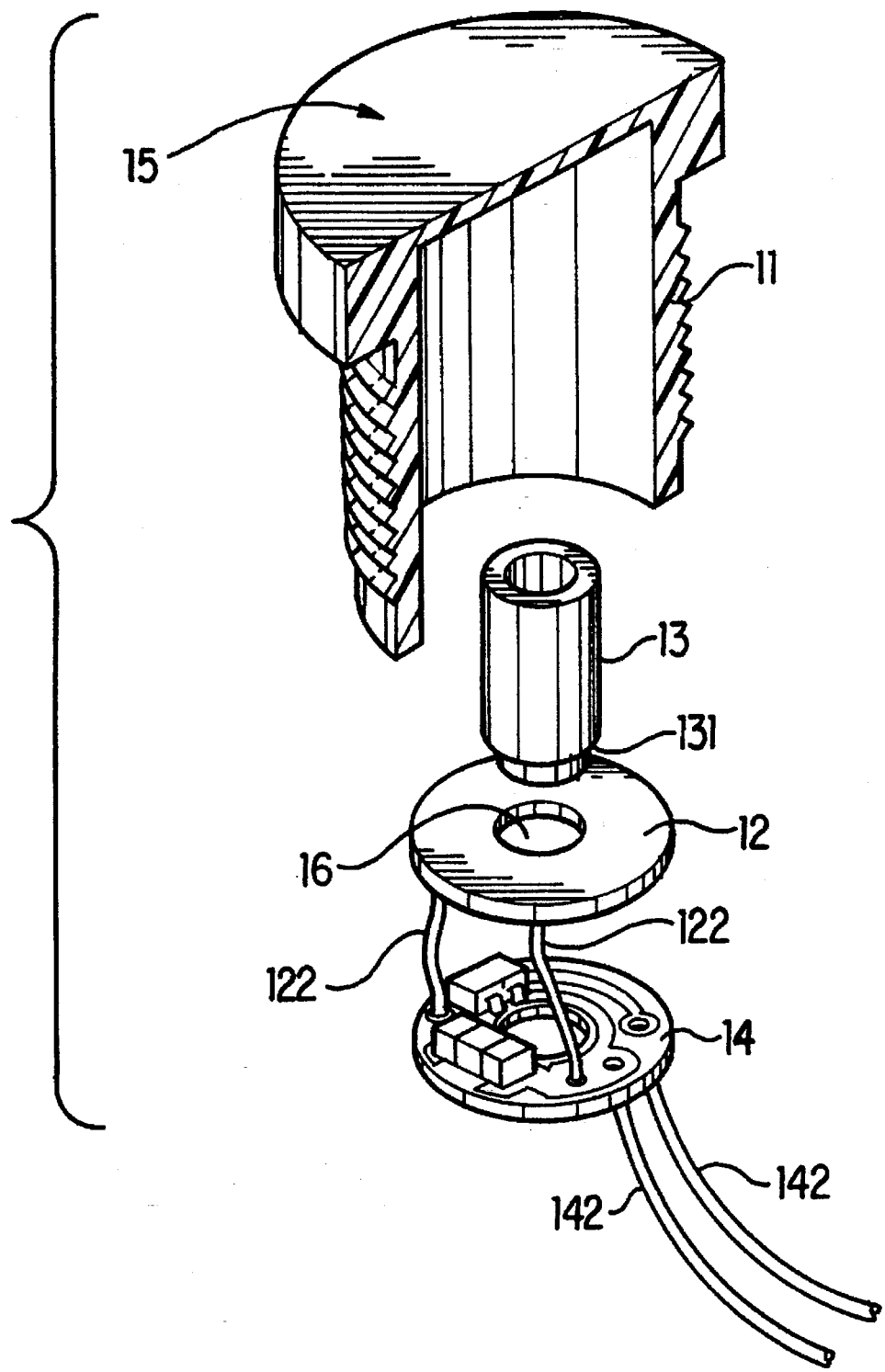
FIG. 1 is an exploded view of a first preferred embodiment of the present invention.

FIG. 1 is an exploded view of a first preferred embodiment of the present invention. In FIG. 1 can be seen a case 11 for a switch in accordance with this embodiment. The case includes push button region 15 on the top. The case is also threaded to permit installation of the switch in a wide range of applications in a manner well known in the art. A piezo crystal element 12 is mounted to the case 11 and includes a contact area which here surrounds the hole 16 that is formed in the crystal 12. Disposed between the case 11 and the crystal element 12 is spacer 13. The upper end of the spacer 13 is in contact with the bottom surface of the push button region 15, and the bottom end of the spacer 13 is inserted in the hole 16 of the crystal element so that a shoulder 131 of the spacer is engaged against the contact area of the crystal. In consequence, a tactile input on the push button region 15 is passed through the plastic spacer 13 to the contact area of the crystal 12. The distortion of the crystal caused by the tactile input produces an electrical output that is passes through wires 122 to electronic circuit 14, which is also disposed in the housing 11. The output from the electric circuit is a switched connection over wires 142.

It can be seen that the crystal is mounted by a distance, determined at least in part by the length of the spacer, away from the push button region 15. This distance provides some thermal isolation between the crystal 12 and the push button region 15.

Figure 2:
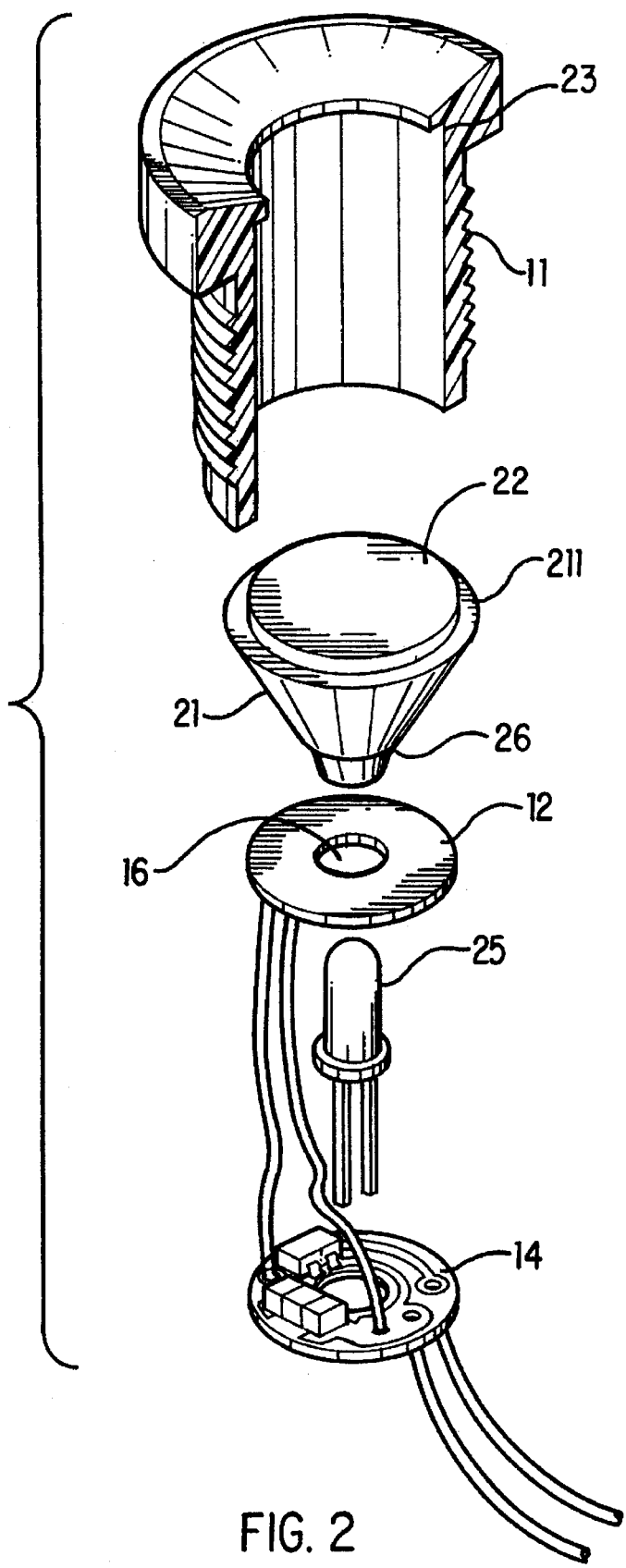
FIG. 2 is an exploded view of a second preferred embodiment in which a lighted push button region (recessed) is provided.

FIG. 2 is an exploded view of a second preferred embodiment in which a lighted push button region (recessed) is provided. The construction of a switch in accordance with this embodiment is similar to that of FIG. 1, but here the spacer is realized as a lens assembly 21. A shoulder 26 is engaged against the contact area of the crystal 12 surrounding hole 16. A light emitting diode 25 is disposed through the hole 16 as well as an opening in the lens assembly 21. The lens assembly 21 is light transmissive so that the light emitting diode 25 produces a light that can be seen through the push button region 22 that has been formed as part of the lens assembly 21. Note that, unlike the embodiment of FIG. 1, the push button region 22 is here formed in the spacer 21 rather than in the case 11. The lens assembly includes a peripheral lip 211 that engages against ledge 23 that is formed in the case. In accordance with this embodiment, it can be seen that the case interior occupied between the inside surface of the push button region 22 and the contact area of the crystal element 12 includes a light source and a light path. This switch provides thermal isolation to the crystal element, and it also provides a convenient way of illuminating the push button region 22.

Figure 3:
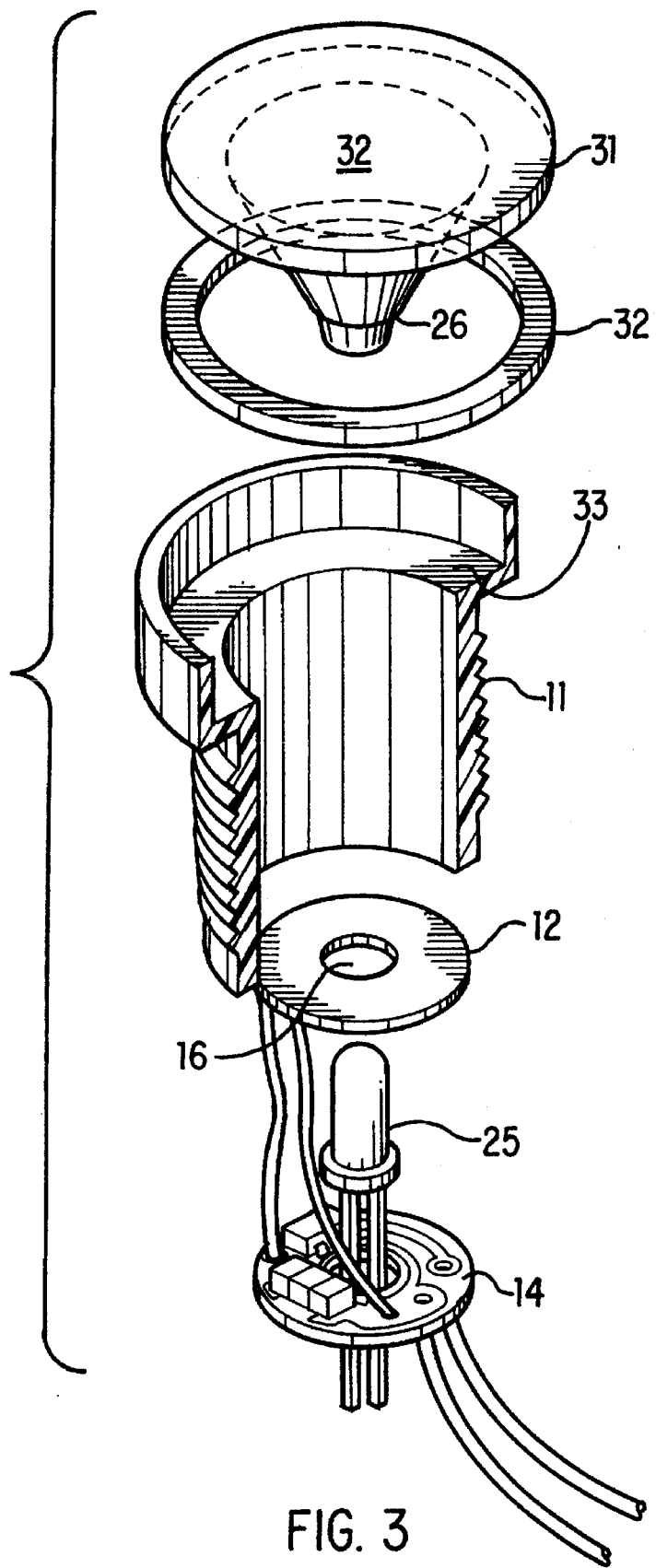
FIG. 3 is an exploded view of an embodiment similar to that of FIG. 2, but in which the lighted push button region is flush.

FIG. 3 is an exploded view of an embodiment similar to that of FIG. 2, but in which the lighted push button region is flush with the exterior of the case. In this figure the spacer-lens assembly rests on shoulder 33 and the periphery 31 engages smoothly against the inside portion of the case 11 lying above the shoulder 33. A gasket 32 is disposed between the lens assembly and the shoulder 33.

Figure 4:
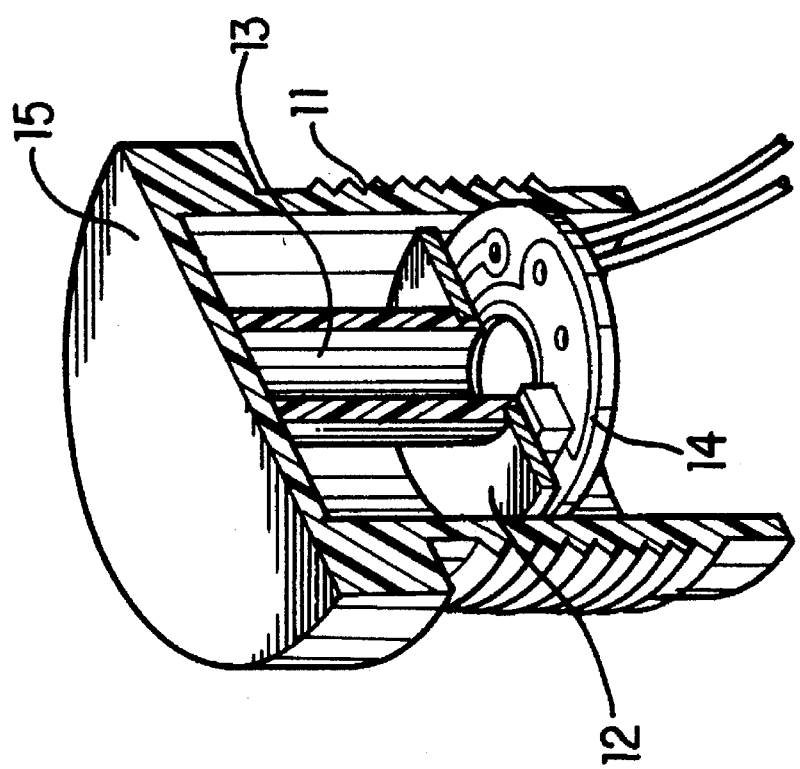
FIG. 4 is a cut away view of the embodiment of FIG. 1.
Figure 5:
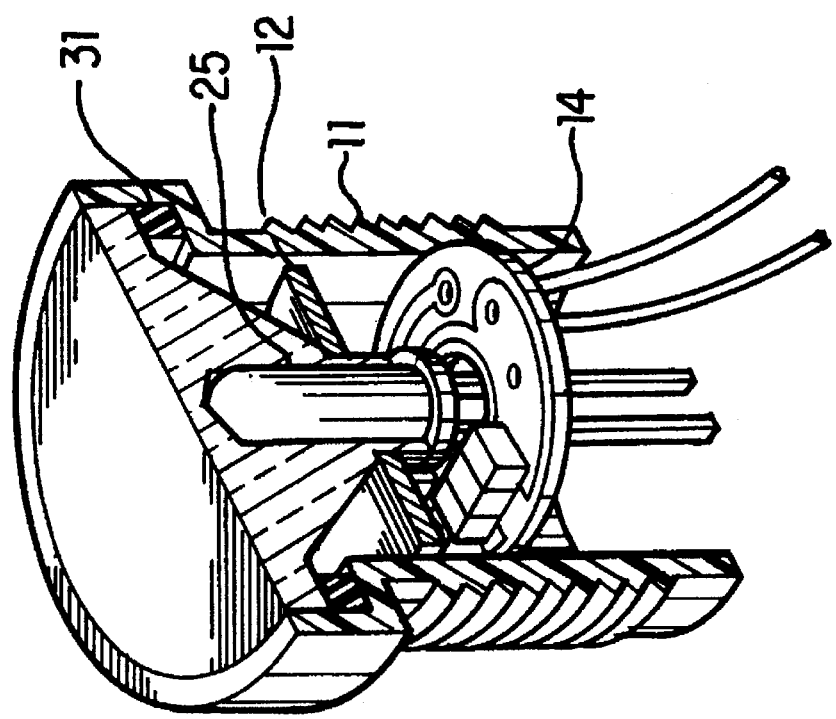
FIG. 5 is a cut away view of the embodiment of FIG. 3.
Figure 6:
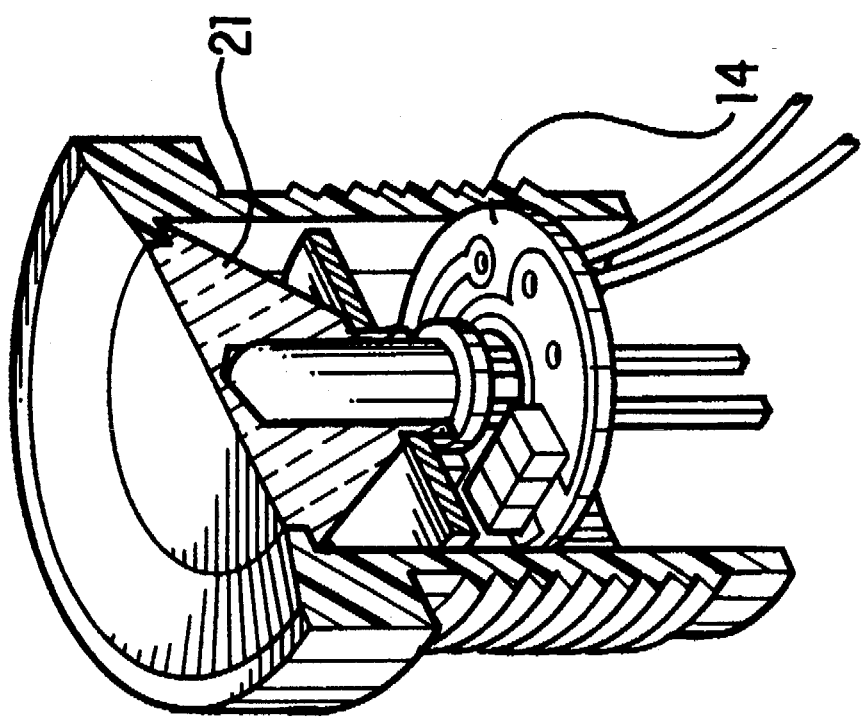
FIG. 6 is a cut away view of the embodiment of FIG. 2.

FIG. 4 is a cut away view of the embodiment of FIG. 1. FIG. 5 is a cut away view of the embodiment of FIG. 3. FIG. 6 is a cut away view of the embodiment of FIG. 2. It can be seen that the same modules including the crystal element 12 electric circuit 14 can be used in all of these embodiments. The case 11 and spacer can be configured in accordance with the particular application desired. In typical applications, the interior of case 11 may be filled in whole or in part with epoxy or other materials to provide a hermetic seal and to hold components in place, although alternatively other means, including selective gluing or thermal bonding, may be employed to hold the components in place and to provide a hermetic seal.

Figure 7:
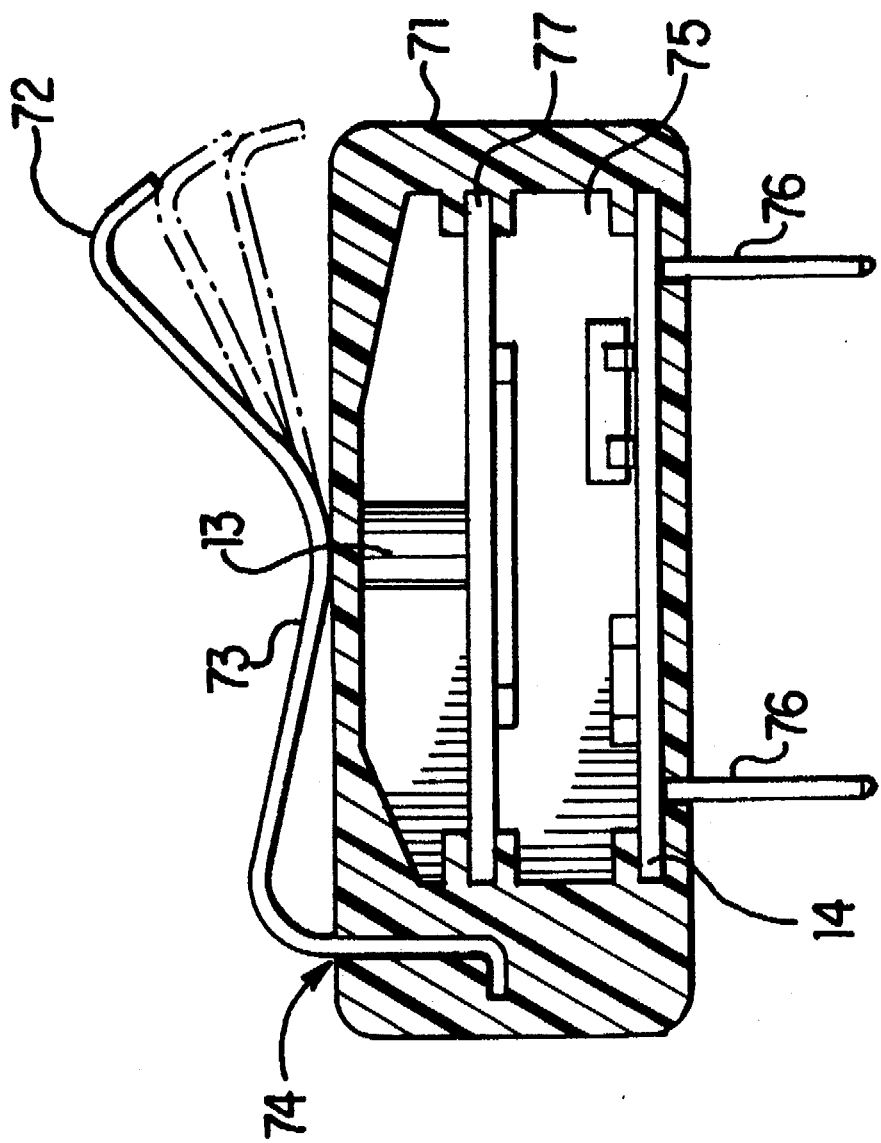
FIG. 7 is a vertical section of a third preferred embodiment of the invention utilizing a leaf spring.

FIG. 7 is a vertical section of a third preferred embodiment of the invention utilizing a leaf spring. The leaf spring has a first region 72 for receiving an external physical input and a second region 73 in contact with the tactile input of the push button region of the case 71. A third region 74 of the spring is anchored to the case. The switch is also provided in this embodiment with the piezo crystal element 77 electric circuit 14 and leads 76. Note that any change in pressure caused by displacement of region 72 will figure a voltage. Accordingly, if the region 72 is displaced between H1 and H2 a voltage is generated and the switch will toggle. If the arm is maintained at H2 and thereafter is moved between H2 and H3 the switch will again toggle. In this way, the spring can accommodate a wide range of physical inputs and can adjust automatically to varying mechanical configurations.

Figure 8:
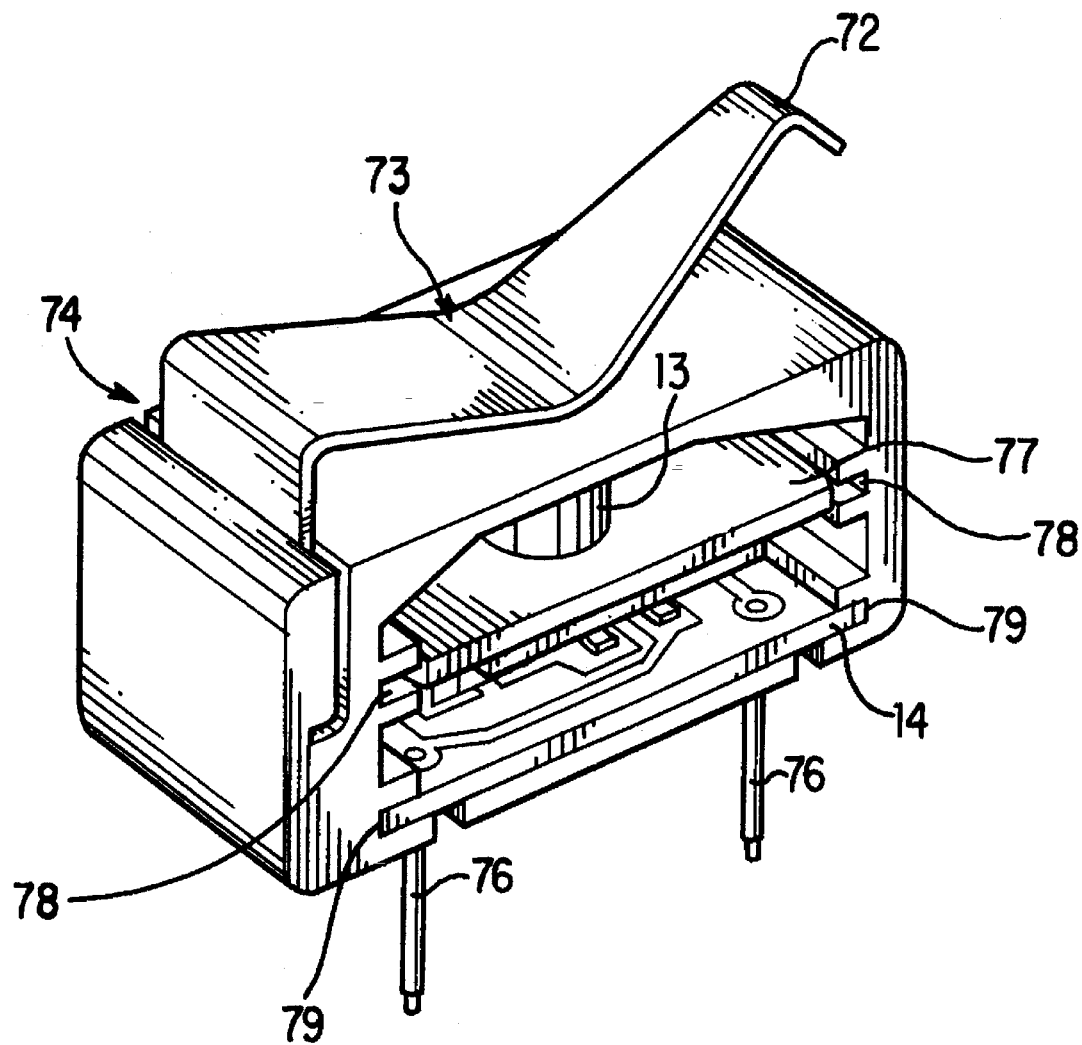
FIG. 8 is a cut away view of the embodiment of FIG. 7.

FIG. 8 is a cut away view of the embodiment of FIG. 7. It can be seen that the crystal 77 is maintained in position by sliding into slots 78, which are oppositely disposed from one another. Similarly, the electric circuit 14 slides into oppositely disposed slots 79.

Figure 9:
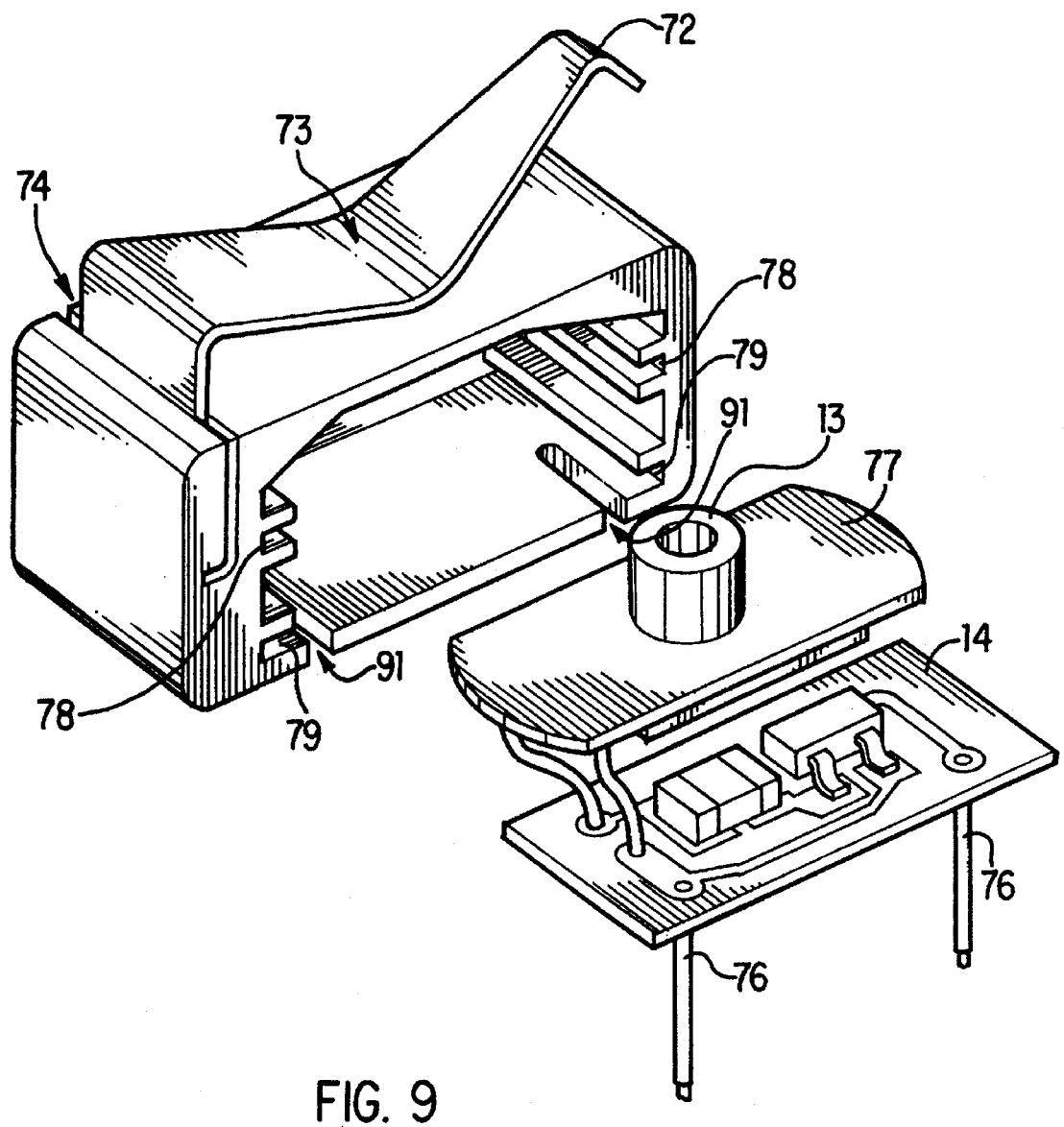
FIG. 9 is an exploded view of the embodiment of FIG. 7.

FIG. 9 is an exploded view of the embodiment of FIG. 7. Here it can be seen also that a pair of slots 91 accommodates the leads 76 emanating from the electric circuit 14.

Figure 11:
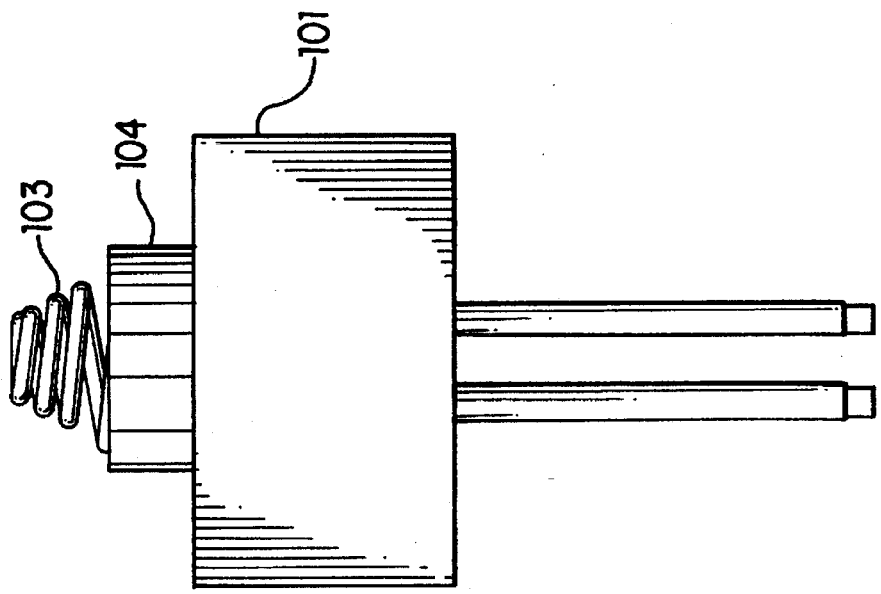
FIGS. 10 and 11 are side views of a fourth preferred embodiment of the invention utilizing coil springs.
Figure 10:
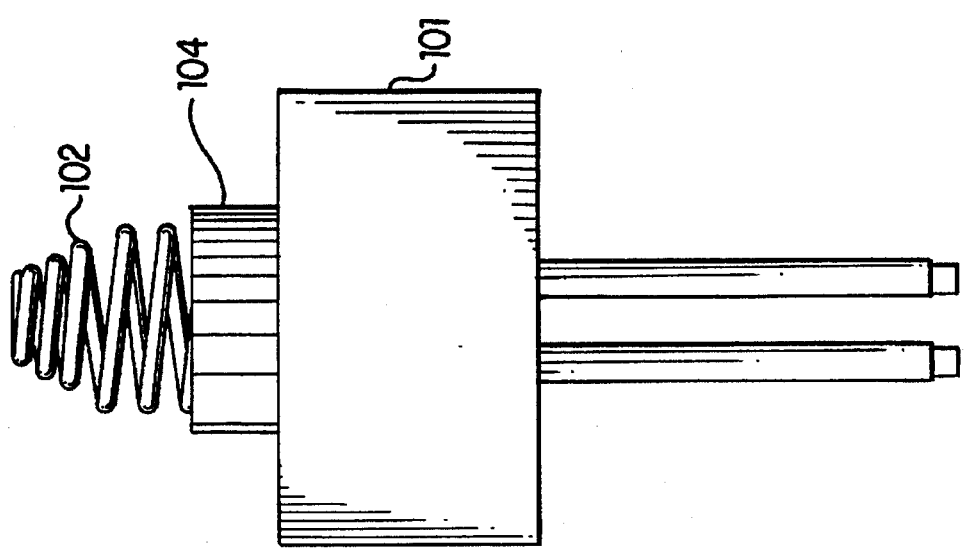

FIGS. 10 and 11 are side views of a fourth preferred embodiment of the invention utilizing coil springs. It can be seen in these figures that a case 101 configured in the general manner of the case 11 of FIG. 1 can be used in lieu of the embodiment of FIG. 9. Here a coil spring of appropriate length shown as item 102 or 103 in FIGS. 10 and 11 respectively can be employed. Such a spring uses the outside (upper end) for contacting an external physical input, and the other end of the spring is in contact with the push button region of the switch. The coil springs can be held in place by circular wall 104 formed around the push button region.

What is claimed is:

1. A piezo switch comprising:
   a light-transmissive member having a first surface accessible to a tactile input and a second surface opposite the first surface;
   a case, for mounting the member;
   a piezo electric crystal element mounted to the case and having a contact area, and wherein the crystal includes a hole and the second surface of the member and the contact area of the crystal define a separation space in the case;
   a light source disposed in the case;
   a spacer, the spacer having a length, mounted in physical communication between the second surface of the member and the contact area of the crystal for transmitting the tactile input, received by the first surface, to the crystal, causing the crystal to provide as a result an electrical response to the tactile input; and wherein the spacer has an opening, the hole and opening being in communication with each other;
   the crystal being mounted by a distance, determined at least in part by the length of the spacer, away from the member, the distance providing an amount of thermal isolation between the crystal and the member;
   a light path from the light source to the member, the light path extending through at least a portion of the separation space, and wherein the light path runs through at least a portion of the spacer, and wherein at least one of the light path and the light source is disposed in the hole and in the opening.

2. A switch according to claim 1, wherein the spacer has an external end forming the member and an internal end in physical communication with the contact area of the crystal.

3. A switch according to claim 2, wherein the hole is formed centrally in the crystal.

4. A switch according to claim 3, wherein the light source is disposed in the spacer.

5. A switch according to claim 4, wherein the light source is a light-emitting diode.

6. A switch according to claim 2, wherein the light source is disposed in the spacer.

7. A piezo switch comprising:
   a member having a first surface accessible to a tactile input, and a second surface opposite the first surface;
   a case, for mounting the member;
   a piezo electric crystal element, having a hole, and being mounted to the case and having a contact area;
   a spacer, the spacer having a length, mounted in physical communication between the second surface of the member and the contact area of the crystal for transmitting the tactile input, received by the first surface, to the crystal, causing the crystal to provide an electrical response to the tactile input, so that the crystal is mounted by a distance determined at least in part by the length of the spacer, away from the member, the distance providing an amount of thermal isolation between the crystal and the member;
   the member being light transmissive;
   the second surface of the member and the contact area of the crystal defining a separation space in the case;
   a light source disposed in the case;
   a light path from the source to the member, the light path extending through at least a portion of the separation space, and wherein the light path runs through at least a portion of the spacer; and
   wherein the hole is formed centrally in the crystal.

8. A piezo switch comprising:
   a member having a first surface accessible to a tactile input and a second surface opposite the first surface;
   a case, for mounting the member;
   a piezo electric crystal element, having a hole, and being mounted to the case and having a contact area in communication with the second surface of the member, wherein tactile input received by the first surface is transmitted to the crystal, causing the crystal to provide as a result an electrical response to the tactile input; and
   a light source disposed in the case, wherein the light source is disposed within the hole of the crystal.

* * * * *